United States Patent
Lee et al.

(10) Patent No.: US 6,688,923 B2
(45) Date of Patent: Feb. 10, 2004

(54) POWER-INTERFACE ASSEMBLY OF SUSCEPTOR FOR USE IN SEMICONDUCTOR FABRICATION APPARATUS

(75) Inventors: Myung-Jin Lee, Seoul (KR); Yong-Jin Kim, Gyeonggi-do (KR); Jong-Yong Choi, Gyeonggi-do (KR)

(73) Assignee: Jusung Engineering Co., Ltd. (KR)

( * ) Notice: Subject to any disclaimer, the term of this patent is extended or adjusted under 35 U.S.C. 154(b) by 0 days.

(21) Appl. No.: 10/303,528

(22) Filed: Nov. 25, 2002

(65) Prior Publication Data

US 2003/0100223 A1 May 29, 2003

(30) Foreign Application Priority Data

Nov. 29, 2001 (KR) ........................................ 2001-75088

(51) Int. Cl.[7] .............................................. H01R 11/22
(52) U.S. Cl. ...................................................... 439/848
(58) Field of Search ................................. 439/682, 848, 439/889, 559, 908

(56) References Cited

U.S. PATENT DOCUMENTS

| | | | | | |
|---|---|---|---|---|---|
| 3,206,707 A | * | 9/1965 | Vetere | ......................... | 439/505 |
| 4,057,310 A | * | 11/1977 | Young | ......................... | 439/35 |
| 4,138,180 A | * | 2/1979 | Bernier | ....................... | 439/682 |
| 4,350,408 A | * | 9/1982 | Hays | ......................... | 439/603 |
| 4,405,195 A | * | 9/1983 | Cherry et al. | ................ | 439/825 |
| 5,490,800 A | * | 2/1996 | Benes et al. | ................. | 439/567 |
| 5,735,716 A | * | 4/1998 | Bilezikjian | ................... | 439/843 |

\* cited by examiner

*Primary Examiner*—Tulsidas Patel
(74) *Attorney, Agent, or Firm*—Duane Morris LLP

(57) ABSTRACT

The present invention provides a susceptor power-interface assembly which is used for a chamber process module that includes a power supply, a process chamber and a susceptor, wherein the susceptor includes a susceptor shaft penetrating a bottom of the process chamber and a susceptor base on which a wafer is disposed for the process. The susceptor power-interface assembly electrically connects the power supply to the susceptor base. For the electrical-connection between the power supply to the suceptor base, the susceptor power-interface assembly includes a first flange at the end of the susceptor shaft, the first flange bent outside from the susceptor shaft; a second flange having a circular shape, the second flange coupled with the first flange using screws; a plurality of connectors penetrating the second flange, wherein one part of each connector is disposed on the inner surface of the second flange and electrically connected to the susceptor base, wherein the other part of each connector is disposed on the outer surface of the second flange; and a plurality of power boots each having a hole so as to cap each connector disposed on the outer surface of the second flange, wherein each connector slide into the hole of each power boot to be coupled with the power boot. The susceptor power-interface assembly further includes an O-ring packing that is interposed between the first and second flanges and made of Teflon.

17 Claims, 5 Drawing Sheets

POWER-INTERFACE ASSEMBLY OF SUSCEPTOR FOR USE IN SEMICONDUCTOR FABRICATION APPARATUS

This application claims the benefit of Korean Patent Application No. 2001-0075088 filed on Nov. 29, 2001 in Korea, which are both hereby incorporated by reference.

BACKGROUND OF THE INVENTION

1. Field of the Invention

The present invention relates to a susceptor base that is installed in a semiconductor fabrication chamber, and more particularly, to a power-interface assembly that connects a power supply to the susceptor base.

2. Description of Related Art

The semiconductor devices, such as a LSI (Large Scale Integrated), a memory IC (Integrated Circuit) and other logic elements, are generally fabricated by repeated depositing and patterning processes on a wafer. Such depositing and patterning processes are generally conducted in a chamber process module including an airtight process chamber.

Such a chamber includes a susceptor therein, and then the wafer is mounted on the susceptor for the semiconductor fabrication. The susceptor includes a heating device therein in order to apply heat to the mounted wafer and then allow a thin film formed on the wafer to have better uniformity. Furthermore, when the wafer is heated during the process, the thin film profile and process repeatability are improved.

FIG. 1 is a conceptual perspective view illustrating a susceptor and a power supply according to a conventional art. As shown, a susceptor base 30b is connected to a shaft 30a shaped like a cylindroid. The susceptor base 30b and the shaft 30a is installed at the bottom of the chamber in a way of that the shaft 30a penetrates the chamber bottom. Thus, the susceptor base 30b is located inside the chamber to receive the wafer thereon, and the shaft 30a is protruded from the chamber bottom to receive electric power. Although not shown in FIG. 1, the susceptor base 30b connected at one end of the shaft 30a includes a heating device therein which is operated by the electric power. At the other end of the shaft 30a, a power-interface assembly 50 is disposed.

Still referring to FIG. 1, the shaft 30a includes first power feed lines 42 that are connected to the heating device of the susceptor 30b. A power supply 90 is connected to second power feed lines 44, and then the second power feed lines 44 extend to the power-interface assembly 50 in order to supply the electric power to the heating device of the susceptor base 30b. The power-interface assembly 50 disposed at the end of the shaft 30a generally includes a circular flange 52, connecting terminals 54, washers 70 and screws 60. The circular flange 52 closes up the end of the cylindroid shaft 30a. The connecting terminals 54 penetrate the circular flange 52 so as to be connected to the first power feed lines 42. First portions of the connecting terminals 54, which are disposed on an inner surface of the circular flange 52, are connected to the first power feed lines 42, while second portions of the connecting terminals 54, which are disposed on an outer surface of the circular flange 52, are connected to the washers 70 by the screws 60. Since the second power feed lines 44 extending from the power supply 90 are electrically connected to the washers 70, the electric power can flow from the power supply 90 to the heating device of the susceptor base 30b. The circular flange 52 is firmly fixed to the shaft 30a so that the connecting terminals 54 are also fixed to the shaft 30a. Further, the washers 70 are fixed to the connecting terminals 54 with the screws 60. The washers 70 connected to the second power feed lines 44 is formed of a conductive material and shaped like a ring so that they can be firmly fixed by the screws 60 that is screwed up to the ends of the connecting terminals 54. Namely, each screw 60 is inserted into each ring-shaped washer 70 and then driven into each connecting terminal 54.

Accordingly, the power-interface assembly 50 electrically connects the second power feed lines 44 to the first power feed lines 42. Moreover, the electric power generated in the power supply 90 is flowing to the heating device of the susceptor base 30b through the second power feed lines 44, through the power-interface assembly 50 and then finally through the first power feed lines 42.

Meanwhile, the semiconductor fabrication process in the process chamber varies depending on the thin film material deposited and patterned on the wafer. In order to conduct such various processes, the susceptor base 30b and the power supply 90 are electrically disconnected and then the chamber is disassembled to change and modify the interior structural elements. Therefore, the power-interface assembly 50 is also disassembled. The screws 60 connected to the connecting terminals 54 are loosened, and then the washers 70 electrically connected to the power supply 90 are detached from the connecting terminals 54. Thereafter, the washers 70 are attached to the connecting terminals 54 and the screws 60 are tightened again for another fabrication process.

In this case of loosening and tightening the screws 60 in the power-interface assembly 50, the operator or worker should drive the screws 60 to connect and disconnect the washers 70 that is connected to the power supply 90. These increase amount of work and decrease operation efficiency, thereby causing the bad productivity.

SUMMARY OF THE INVENTION

Accordingly, the present invention is directed to a power-interface assembly that substantially overcome one or more of the problems due to limitations and disadvantages of the related art.

To overcome the problems described above, an advantage of the present invention is to provide a sesceptor power-interface assembly that accomplishes an easy electrical connection and disconnection between a susceptor base and a power supply.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides a susceptor power-interface assembly which is used for a chamber process module that includes a power supply, a process chamber and a susceptor, wherein the susceptor includes a susceptor shaft penetrating a bottom of the process chamber and a susceptor base on which a wafer is disposed for the process. The susceptor power-interface assembly electrically connects the power supply to the susceptor base. The susceptor power-interface assembly includes a first flange at the end of the susceptor shaft, the first flange bent outside from the susceptor shaft; a second flange having a circular shape, the second flange coupled with the first flange using screws; a plurality of connectors penetrating the second flange, wherein one part of each connector is disposed on the inner surface of the second flange and electrically connected to the susceptor base, wherein the other part of each connector is disposed on the outer surface of the second flange; and a plurality of power boots each having a hole so as to cap each connector disposed on the outer surface of the second flange, wherein each connector slide into the hole of each power boot to be coupled with the power boot. The susceptor power-interface assembly further includes an O-ring packing that is interposed between the first and second flanges and made of Teflon. The first flange have first connecting holes and the second flange have second connecting hole so that each screw penetrates each first connecting hole and second connecting hole to couple the second flange with the first flange. The first flange is perpendicular to the axis of the susceptor shaft and broadens the bottom of the sesceptor shaft. The plurality of power boots are connected to a power supply to receive electric power. Each power boot is connected to each connector by pushing in and disconnected to each connector by pulling out.

In another aspect of the present invention, the connectors have a streamline shape that becomes narrower as it goes to the end, and the holes of the power boots have a streamline shape that corresponds to the streamline-shaped connector. The connector has a step on its outer surface and the power boot has a step on its inner surface in the hole. The step of the power boot corresponds to the step of the connector, and maintains the connection between the connector and the power boot.

In another aspect of the present invention, the connector has at least a protrusions and the power boot has at least a concave portion on its inner surface in the hole. The protrusion of the connector corresponds to the concave portion of the power boot. Further, the protrusion is shaped like O-ring and surrounds the connector.

In another aspect of the present invention, the connector has an unevenness outer surface and the power boot has an unevenness inner surface in the hole. The unevenness outer surface of the connector corresponds to the unevenness inner surface of the power boot. The unevenness outer surface of the connector and the unevenness inner surface of the power boot have a sawteeth-shape. The sawteeth-shaped unevenness outer surface of the connector is fixed to the sawteeth-shaped unevenness inner surface of the hole when the power boot caps the connector.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment of the invention and together with the description serve to explain the principle of the invention. In the drawings.

DETAILED DESCRIPTION OF ILLUSTRATED EMBODIMENTS

Reference will now be made in detail to illustrated embodiment of the present invention, examples of which are shown in the accompanying drawings. Wherever possible, the same reference numbers will be used throughout the drawings to refer to the same or like parts.

Figure 1:
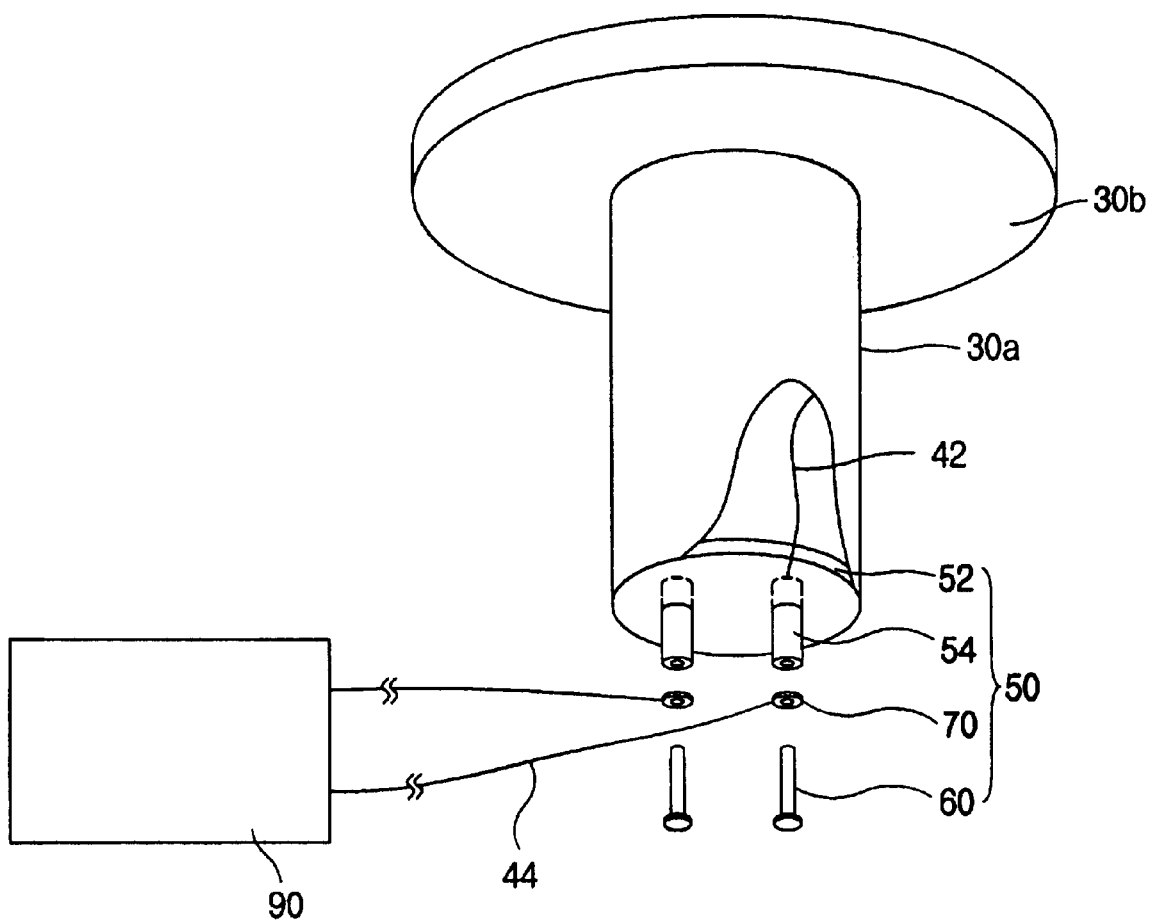
FIG. 1 is a conceptual perspective view illustrating a susceptor and a power supply according to a conventional art.
Figure 2:
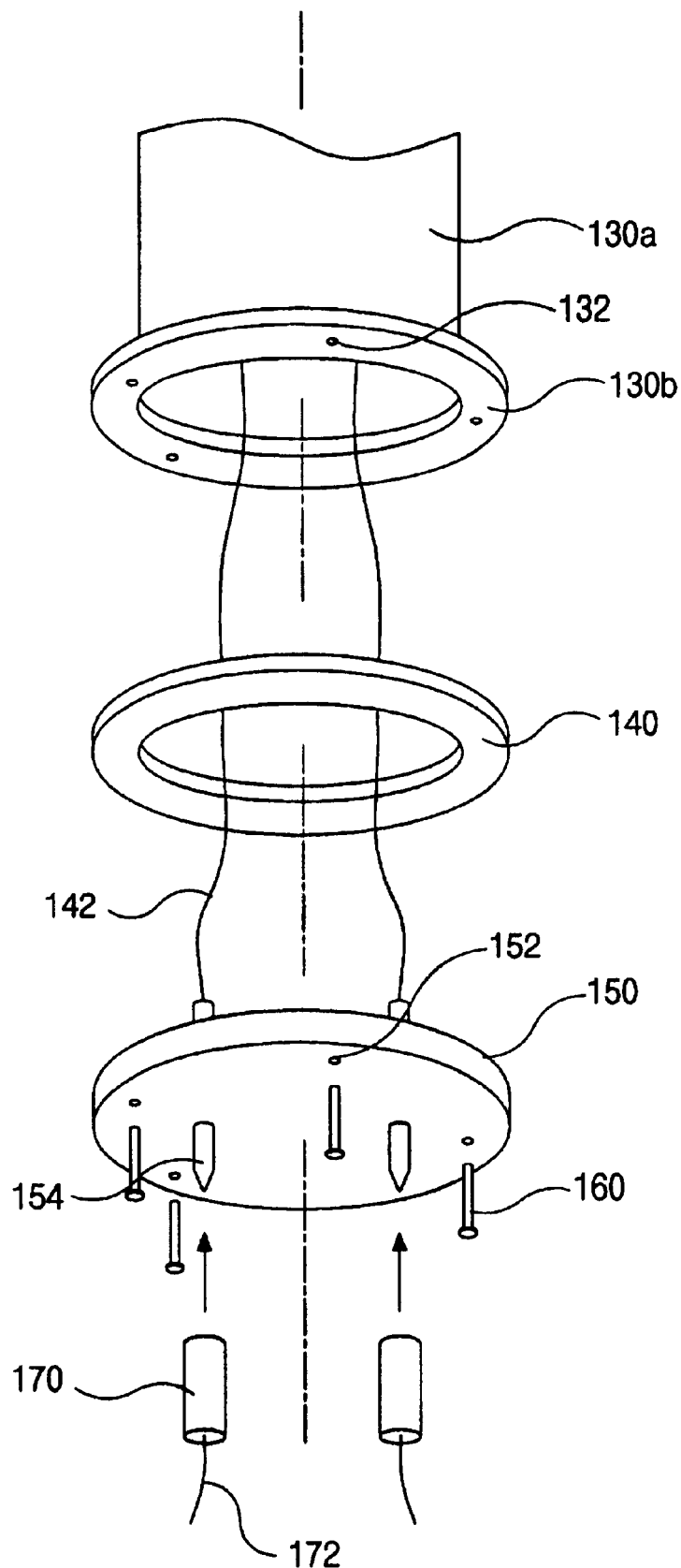
FIG. 2 is an exploded perspective view illustrating a susceptor power-interface assembly according to the present invention.

FIG. 2 is an exploded perspective view illustrating a susceptor power-interface assembly according to the present invention. As shown, the susceptor power-interface assembly widely includes a susceptor shaft 130a, an O-ring packing 140, a second flange 150, and power boots 170. The susceptor shaft 130a has a first flange 130b at the end thereof so that it can be coupled with the second flange 150. The first flange 130b is bent outside from the susceptor shaft 130a and perpendicular to the axis of the susceptor shaft 130a so that it substantially broadens the bottom of the sesceptor shaft 130a. A plurality of first connecting holes 132 are formed in the first flange 130b and a plurality of second connecting holes 152 are formed in the second flange 150 so as to couple the first and second flanges 130b and 150 with screws 160. Between the first and second flanges 130b and 150, the O-ring packing is disposed. When the second flange 150 is joined to the first flange 130b by the screws 160, the O-ring packing 140 is put between the first and second flanges 130b and 150.

Still referring to FIG. 2, the second flange 150 having a circular shape closes up the end of the susceptor shaft 130a and is tightly fixed thereto by the screws 160. The O-ring packing 140 tightly seals the gap between the first and second flanges 130b and 150. The O-ring packing 140 is beneficially made of Teflon, such as polytetrafluoroethylene (PTFE), which has a thermal resistance and good elasticity. The second flange 150 connected to the first flange 130b of the susceptor shaft 130a has a plurality of connectors 154 that penetrate the second flange 150. One end of each connector 154 is on the inner surface of the second flange 150 and the other end of each connector 154 is on the outer surface of the second flange 150. As mentioned before, the second flange 150 has the plurality of second connecting holes 152 to be screwed up to the first flanged 130b by the screws 160. Thus, the screws 160 sequentially penetrate the second connecting holes 152 of the second flange 150, the O-ring packing 140 and the first connecting holes 132 of the first flange 130b. The inner parts of the connectors 154 are connected to first power feed lines 142 that are connected to the heating device of the susceptor (not shown). The outer parts of the connectors 154 are connected to power boots 170 each of that is connected to a second power feed line 172. Although not shown in FIG. 2, the power supply is electrically connected the second power feed lines 172 so that the electric power can flow to the heating device (not shown) through the second and first power feeds lines 172 and 142 when the power boots 170 are coupled to the outer parts of the connectors 154. Namely, the power boots 170 cap the outer parts of the connectors 154 as an inserting manner. The structures of the connectors 154 and the power boots 170 can vary as the following embodiments.

Figure 3:
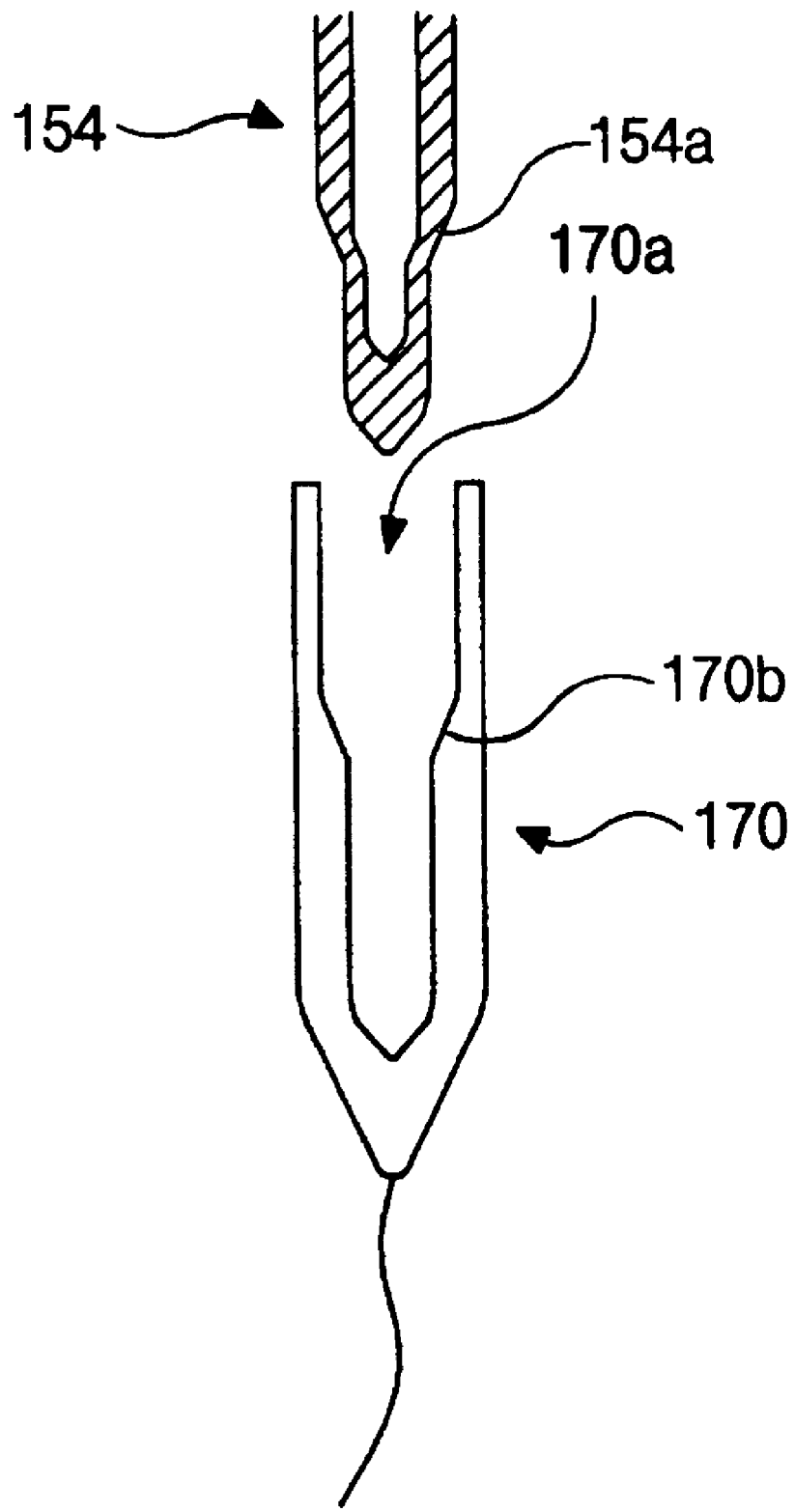
FIG. 3 is a cross-sectional view illustrating a connector and a power boot according to a first embodiment of the present invention.

FIG. 3 is a cross-sectional view illustrating a connector and a power boot according to a first embodiment of the present invention. As shown in FIG. 3, the end of the connector 154 has a streamline shape that becomes narrower as it goes to the end, and the power boot 170 has also a streamlined hole 170a that corresponds to the end of the connector 154. Thus, the connector 154 can slide down the streamlined hole 170a to be coupled with the power boot 170. Especially to have a more strong connection between the connector 154 and the power boot 170, the connector 154 has a step 154a on its outer surface and the power boot 170 has also a step 170b on its inner surface in the hole 170a. The step 170b of the power boot 170 corresponds to the step 154a of the connector 154. These connecting structures maintain the connection between the connector 154 and the power boot 170, and let their connection and disconnection to be much simpler.

Figure 4:
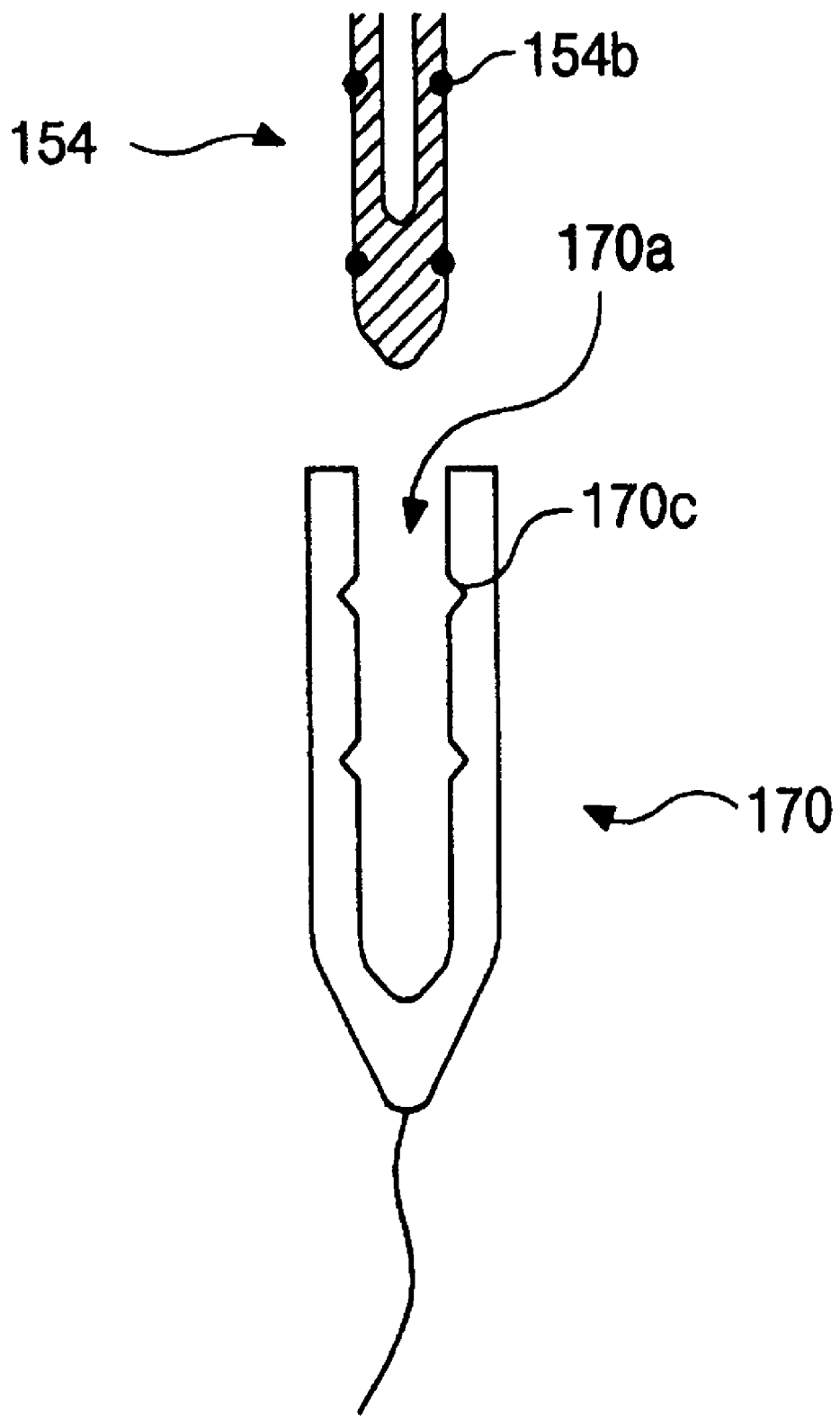
FIG. 4 is a cross-sectional view illustrating a connector and a power boot according to a second embodiment of the present invention.

FIG. 4 is a cross-sectional view illustrating a connector and a power boot according to a second embodiment of the present invention. As shown in FIG. 4, the connector 154 and a hole 170a of the power boot 170 have a streamline shape as like the first embodiment. However, the connector 154 and the power boot 170 do not have the steps. Instead of the steps, the connector 154 has protrusions 154b, and the power boot 170 has concave portions 170c on its inner surface in the hole 170a. The protrusions 154b of the connector 154 and the concave portions 170c of the power boot 170 correspond to each other. The protrusions 154b can be shaped like O-ring and surround the connector 154. Accordingly with reference to FIG. 4, the protrusions 154b of the connector 154 and the concave portions 170c of the power boot 170 firmly maintain the connection between the connector 154 and the power boot 170 in the susceptor power-interface assembly of FIG. 2, and let their connection and disconnection to be much simpler.

Figure 5:
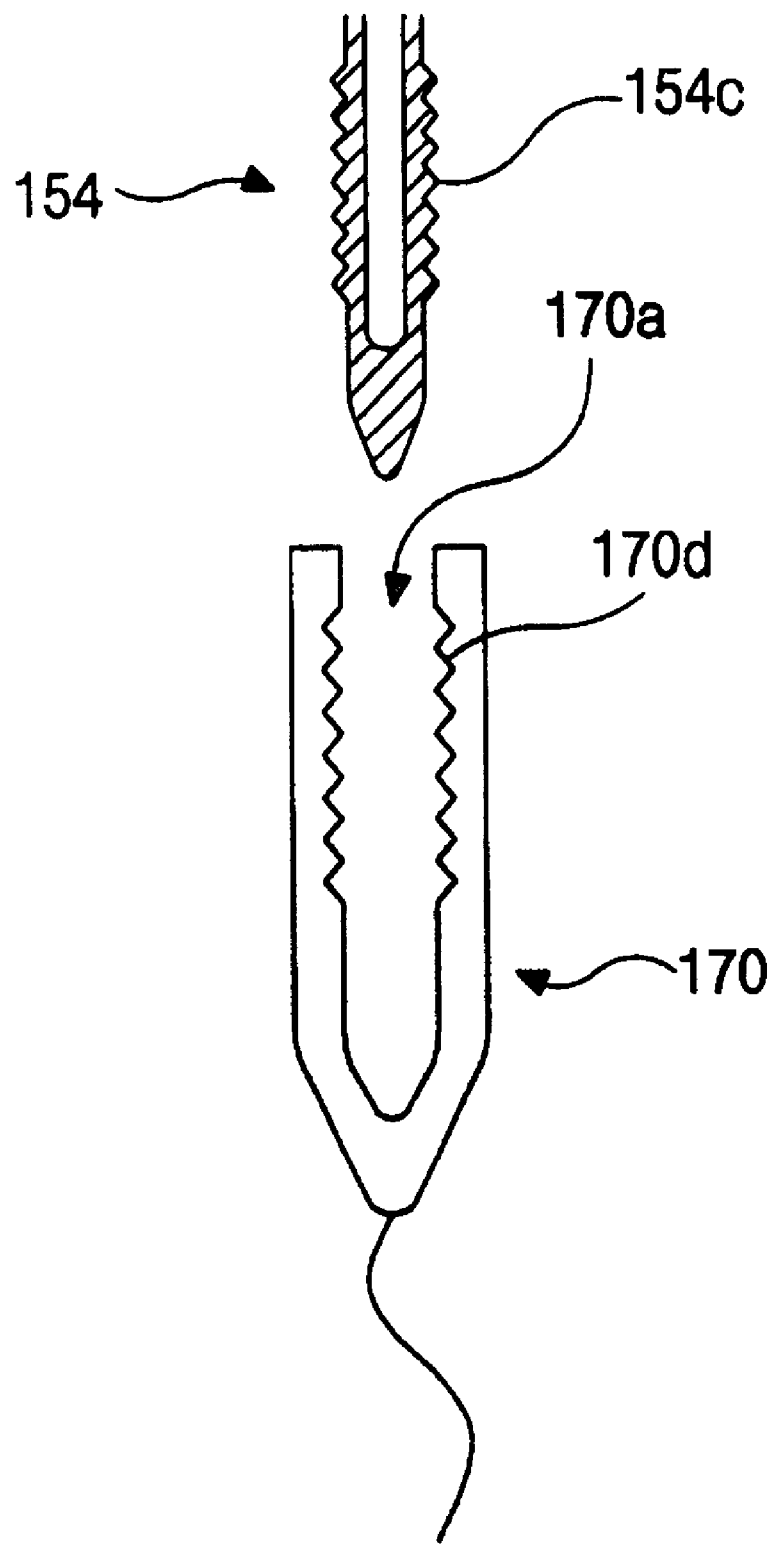
FIG. 5 is a cross-sectional view illustrating a connector and a power boot according to a third embodiment of the present invention.

FIG. 5 is a cross-sectional view illustrating a connector and a power boot according to a third embodiment of the present invention. As shown, the connector 154 and the power boot 170 are similar to the second embodiment, but a little bit different. The connector 154 has an unevenness outer surface 154c, and the power boot 170 has an unevenness inner surface 170d in the hole 170a. The unevenness outer surface 154c and the unevenness inner surface 170d have a sawteeth-shape and correspond to each other. When capping the power boot 170 to the connector 154, the connector 154 slide into the hole 170a of the power boot 170 so that the sawteeth-shaped unevenness 154c of the connector 154 is fixed to the sawteeth-shaped unevenness 170d of the hole 170a. When disconnecting the power boot 170 from the connector 154, the power boot 170 is pulled out of the connector 154 and thus the sawteeth-shaped unevenness 154c of the connector 154 is detached from the sawteeth-shaped unevenness 170d of the hole 170a. Accordingly, the structures with reference to FIG. 5 firmly maintain the connection between the connector 154 and the power boot 170, and let their connection and disconnection to be much simpler.

As described hereinbefore, the connector 154 and the power boot 170 of the present invention make the operator or worker easy to work, because the power boot 170 is easily connected to the connector 154 by pushing in and disconnected by pulling out. Furthermore, according to the present invention, since the O-ring packing 140 of FIG. 2 is made of Teflon, such as polytetrafluoroethylene (PTFE), the connection between the first and second flanges 130b and 150 is much strengthened.

It will be apparent to those skilled in the art that various modifications and variations can be made in the present invention without departing from the spirit or scope of the inventions. Thus, it is intended that the present invention cover the modifications and variations of this invention provided they come within the scope of the appended claims and their equivalents.

What is claimed is:

1. A susceptor power-interface assembly which is used for a chamber process module that includes a power supply, a process chamber and a susceptor, wherein the susceptor includes a susceptor shaft penetrating a bottom of the process chamber and a susceptor base on which a wafer is disposed for the process, and wherein the susceptor power-interface assembly electrically connects the power supply to the susceptor base, the susceptor power-interface assembly comprising:

a first flange at the end of the susceptor shaft, the first flange bent outside from the susceptor shaft;

a second flange having a circular shape, the second flange coupled with the first flange using screws;

a plurality of connectors penetrating the second flange, wherein one part of each connector is disposed on the inner surface of the second flange and electrically connected to the susceptor base, wherein the other part of each connector is disposed on the outer surface of the second flange; and a plurality of power boots each having a hole so as to cap each connector disposed on the outer surface of the second flange, wherein each connector slide into the hole of each power boot to be coupled with the power boot.

2. The susceptor power-interface assembly of claim 1, further comprising an O-ring packing interposed between the first and second flanges.

3. The susceptor power-interface assembly of claim 2, wherein the O-ring packing is made of Teflon.

4. The susceptor power-interface assembly of claim 1, wherein the first flange have first connecting holes and the second flange have second connecting hole so that each screw penetrates each second connecting hole and first connecting hole to couple the second flange with the first flange.

5. The susceptor power-interface assembly of claim 1, wherein the first flange is perpendicular to the axis of the susceptor shaft and broadens the bottom of the sesceptor shaft.

6. The susceptor power-interface assembly of claim 1, wherein the plurality of power boots are connected to a power supply to receive electric power.

7. The susceptor power-interface assembly of claim 1, wherein each power boot is connected to each connector by pushing in and disconnected to each connector by pulling out.

8. The susceptor power-interface assembly of claim 1, wherein the connectors have a streamline shape that becomes narrower as it goes to the end, and the holes of the power boots have a streamline shape that corresponds to the streamline-shaped connector.

9. The susceptor power-interface assembly of claim 8, wherein the connector has a step on its outer surface and the power boot has a step on its inner surface in the hole.

10. The susceptor power-interface assembly of claim 9, wherein the step of the power boot corresponds to the step of the connector, and maintains the connection between the connector and the power boot.

11. The susceptor power-interface assembly of claim 1, wherein the connector has at least a protrusions and the power boot has at least a concave portion on its inner surface in the hole.

12. The susceptor power-interface assembly of claim 11, wherein the protrusion of the connector corresponds to the concave portion of the power boot.

13. The susceptor power-interface assembly of claim 12, wherein the protrusion is shaped like O-ring and surrounds the connector.

14. The susceptor power-interface assembly of claim 1, wherein the connector has an unevenness outer surface and the power boot has an unevenness inner surface in the hole.

15. The susceptor power-interface assembly of claim 14, wherein the unevenness outer surface of the connector corresponds to the unevenness inner surface of the power boot.

16. The susceptor power-interface assembly of claim 15, wherein the unevenness outer surface of the connector and the unevenness inner surface of the power boot have a sawteeth-shape.

17. The susceptor power-interface assembly of claim 16, wherein the sawteeth-shaped unevenness outer surface of the connector is fixed to the sawteeth-shaped unevenness inner surface of the hole when the power boot caps the connector.

* * * * *